(12) United States Patent
Sancon

(10) Patent No.: US 11,568,930 B2
(45) Date of Patent: *Jan. 31, 2023

(54) ELECTRICAL DISTANCE-BASED WAVE SHAPING FOR A MEMORY DEVICE

(71) Applicant: Micron Technology, Inc., Boise, ID (US)

(72) Inventor: John Christopher Sancon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/484,136

(22) Filed: Sep. 24, 2021

(65) Prior Publication Data
US 2022/0013168 A1    Jan. 13, 2022

Related U.S. Application Data

(63) Continuation of application No. 16/903,921, filed on Jun. 17, 2020, now Pat. No. 11,170,851.

(51) Int. Cl.
*G11C 11/00* (2006.01)
*G11C 13/00* (2006.01)

(52) U.S. Cl.
CPC ........ *G11C 13/003* (2013.01); *G11C 13/0026* (2013.01); *G11C 13/0028* (2013.01)

(58) Field of Classification Search
CPC .............. G11C 13/003; G11C 13/0026; G11C 13/0028
USPC ........................................................ 365/148
See application file for complete search history.

(56) References Cited

U.S. PATENT DOCUMENTS

| | | | |
|---|---|---|---|
| 7,532,518 B2 | 5/2009 | Yang et al. | |
| 9,343,156 B1 | 5/2016 | Mui et al. | |
| 2007/0058425 A1 | 3/2007 | Cho et al. | |
| 2012/0134213 A1 | 5/2012 | Choi et al. | |
| 2015/0235704 A1* | 8/2015 | Cunningham | G11C 16/30 365/185.18 |

FOREIGN PATENT DOCUMENTS

| | | |
|---|---|---|
| TW | 200905682 A | 2/2009 |
| TW | 202015047 A | 4/2020 |

OTHER PUBLICATIONS

TW office Action for TW Application No. 110122050 dated Dec. 27, 2021, 7 Pages.

* cited by examiner

*Primary Examiner* — Vu A Le
(74) *Attorney, Agent, or Firm* — Fletcher Yoder, P.C.

(57) ABSTRACT

Memory devices may have an array of elements in two or more dimensions. The memory devices use multiple access lines arranged in a grid to access the memory devices. Memory cells located at intersections of the access lines in the grid. Drivers are used for each access line and configured to transmit a corresponding signal to respective memory cells of the plurality of memory cells via a corresponding access line. The memory devices uses an electrical distance calculator to determine an electrical distance from a memory cell to a respective driver of the plurality of drivers. The memory device also uses a driver modulator to modulate the corresponding signal based at least in part on the electrical distance.

20 Claims, 6 Drawing Sheets

ELECTRICAL DISTANCE-BASED WAVE SHAPING FOR A MEMORY DEVICE

CROSS-REFERENCE TO RELATED APPLICATIONS

This application is a continuation of U.S. application Ser. No. 16/903,921, filed Jun. 17, 2020, and entitled, "ELECTRICAL DISTANCE-BASED WAVE SHAPING FOR A MEMORY DEVICE," the disclosure of which is hereby incorporated by reference in its entirety.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. As may be appreciated, some memory cells at some intersections of the wordlines and bitlines may be farther from drivers than other memory cells at other intersections. Due to the different electrical properties of paths between the different intersections and drivers, the memory cells may react differently. For instance, near memory cells to the drivers may wear more quickly than far memory cells.

BRIEF DESCRIPTION OF THE DRAWINGS

Various aspects of this disclosure may better be understood upon reading the following detailed description and upon reference to the drawings in which.

DETAILED DESCRIPTION

Figure 1:
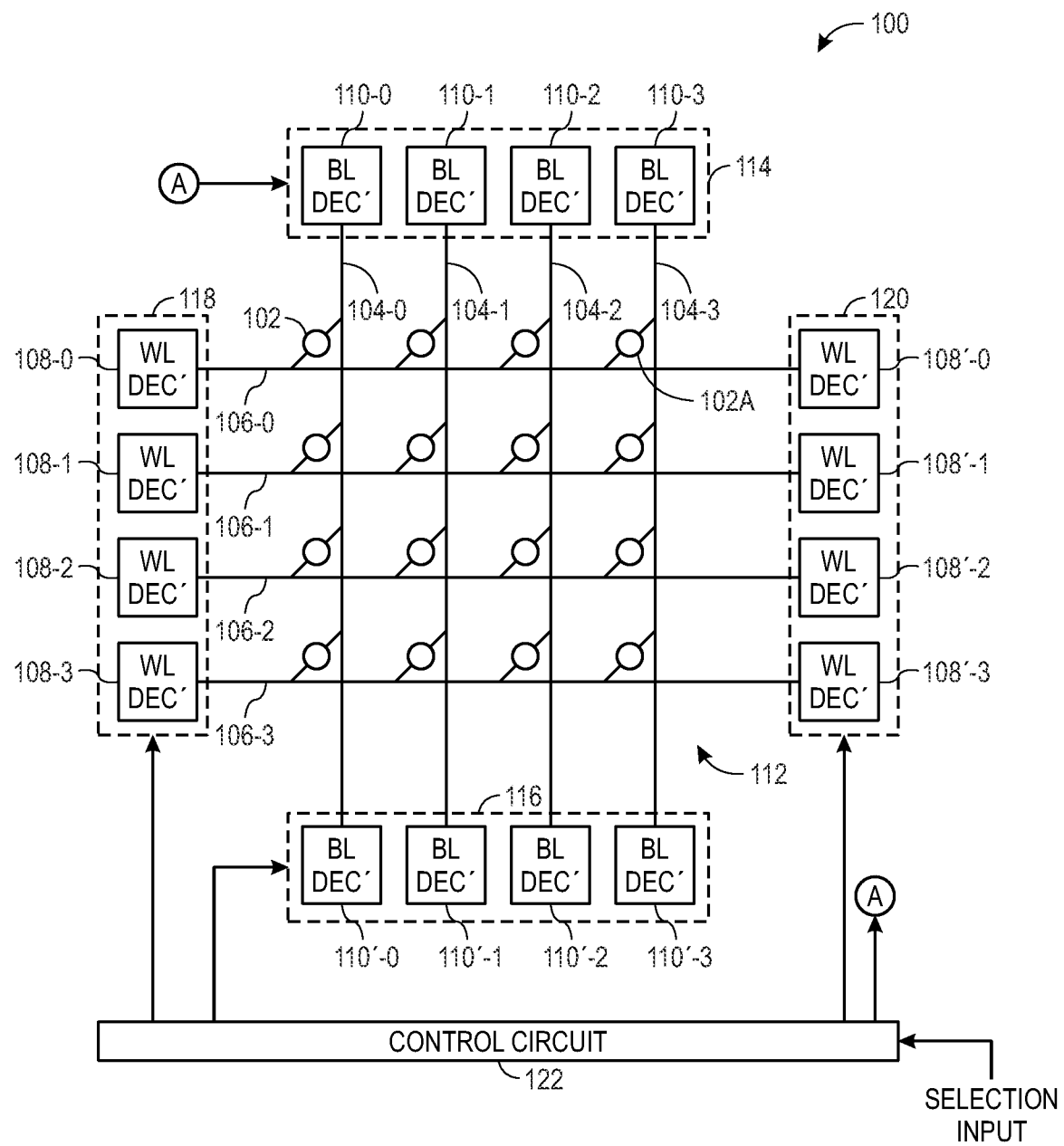
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. Some of the intersections may be relatively close to the wordline drivers and/or the bitline drivers while others of the intersections may be relatively far from the wordline drivers and/or the bitline drivers. The transmission lines between the drivers and the intersections may differ. For example, the differences may be related to parasitic capacitances in the transmission lines and/or resistances in the transmission lines. These different lengths and electrical parameters are referred to herein as an electrical distance (ED). Due to the difference in transmission lines between the close intersections and the far intersections, the different intersections may receive voltage and/or current transmissions from the drivers at different levels and/or with different waveshapes. These differences in voltage/current or waveshapes at the different intersections may cause the close memory cells to undergo more stress with rapid current/voltage changes to which the far memory cells may not be subject. Accordingly, the close memory cells may wear more quickly than the far memory cells.

To compensate for such uneven wear and/or response, the memory device may wave shape the transmitted current and/or voltage based at least in part on an electrical distance of an intersection corresponding to a memory cell being accessed. By modulating the wave shape based on the ED, the close intersections and the far intersections may receive signals that are approximately the same shape causing the memory cells at the respective intersections to behave similarly and/or wear evenly. A drive modulator may be used to control the waveshape of the transmitted current and/or voltage. For example, the drive modulator may modulate a control signal applied to a gate of a transistor that controls the waveshape of the transmitted current and/or voltage. The drive modulator may be implemented using a resistor-capacitor (RC) filter to apply a low-pass filtration to smooth a square pulse to a more gradual slope. The capacitor of the RC filter may be variable and set with a capacitance configured to filter the control signals to more strongly filter signals sent to near intersections. Alternatively, the drive modulator may be implemented using a current mirror having a different number of legs based on the ED of the respective memory cell being accessed.

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-4 may operate in conjunction with bitline decoder 110'-4 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to selector device (SD) material of the memory cell) and reading the memory cells 102 (e.g., in particular, reading a voltage stored by the SD material of the memory cell) using a signal with a given (e.g., known) fixed polarity.

Figure 2:
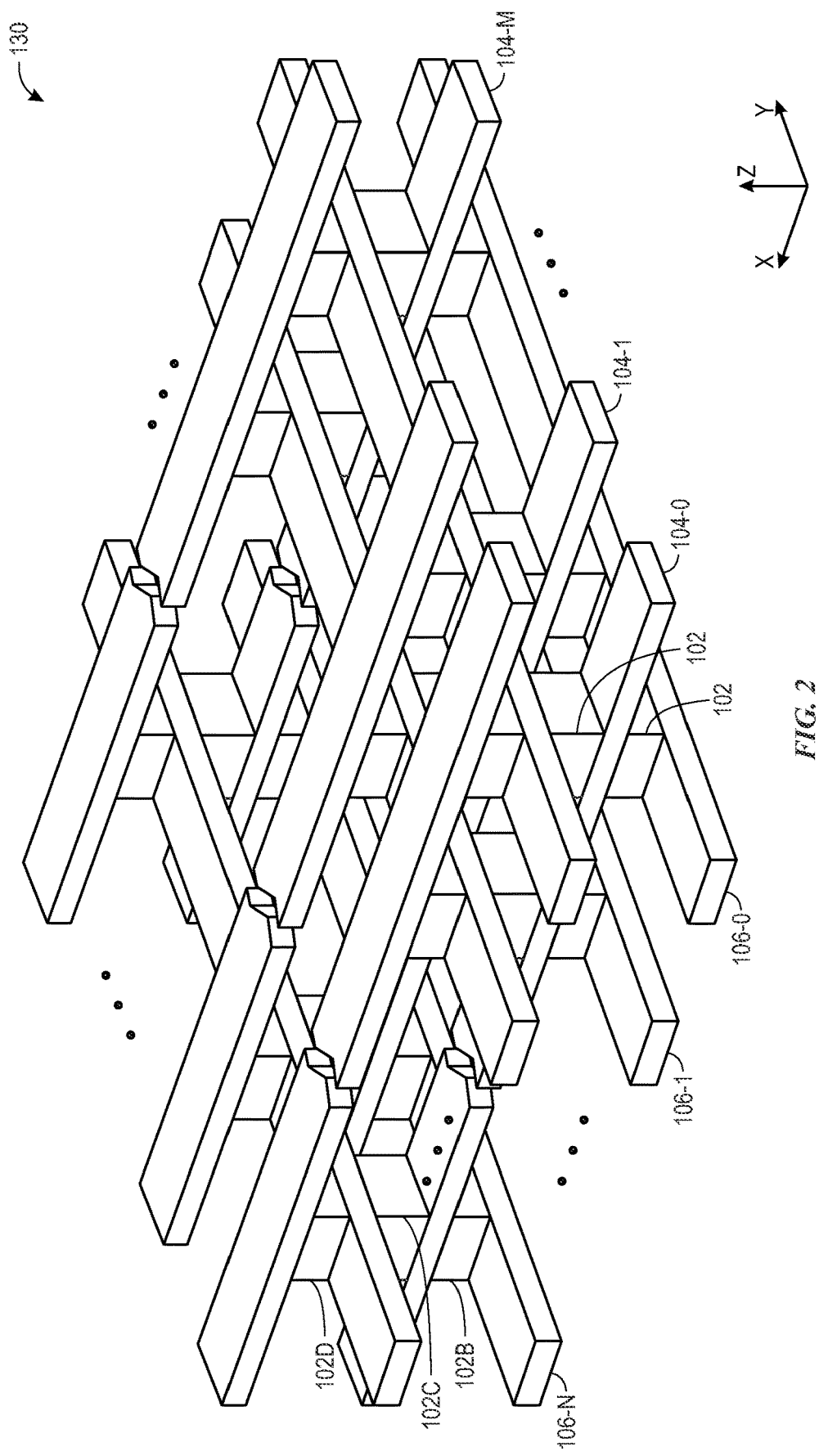
FIG. 2 is a side-view of a diagram illustrating the portion of the memory array of FIG. 2, according to an embodiment of the present disclosure.

FIG. 2 is a diagram illustrating a portion of a memory array 130 in accordance with an embodiment of the present disclosure. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or less bitlines 104, wordlines 106, and/or memory cells 102 than shown in the examples of FIG. 2. Each deck may include one or more memory cells 102 aligned in a same plane.

Figure 3:
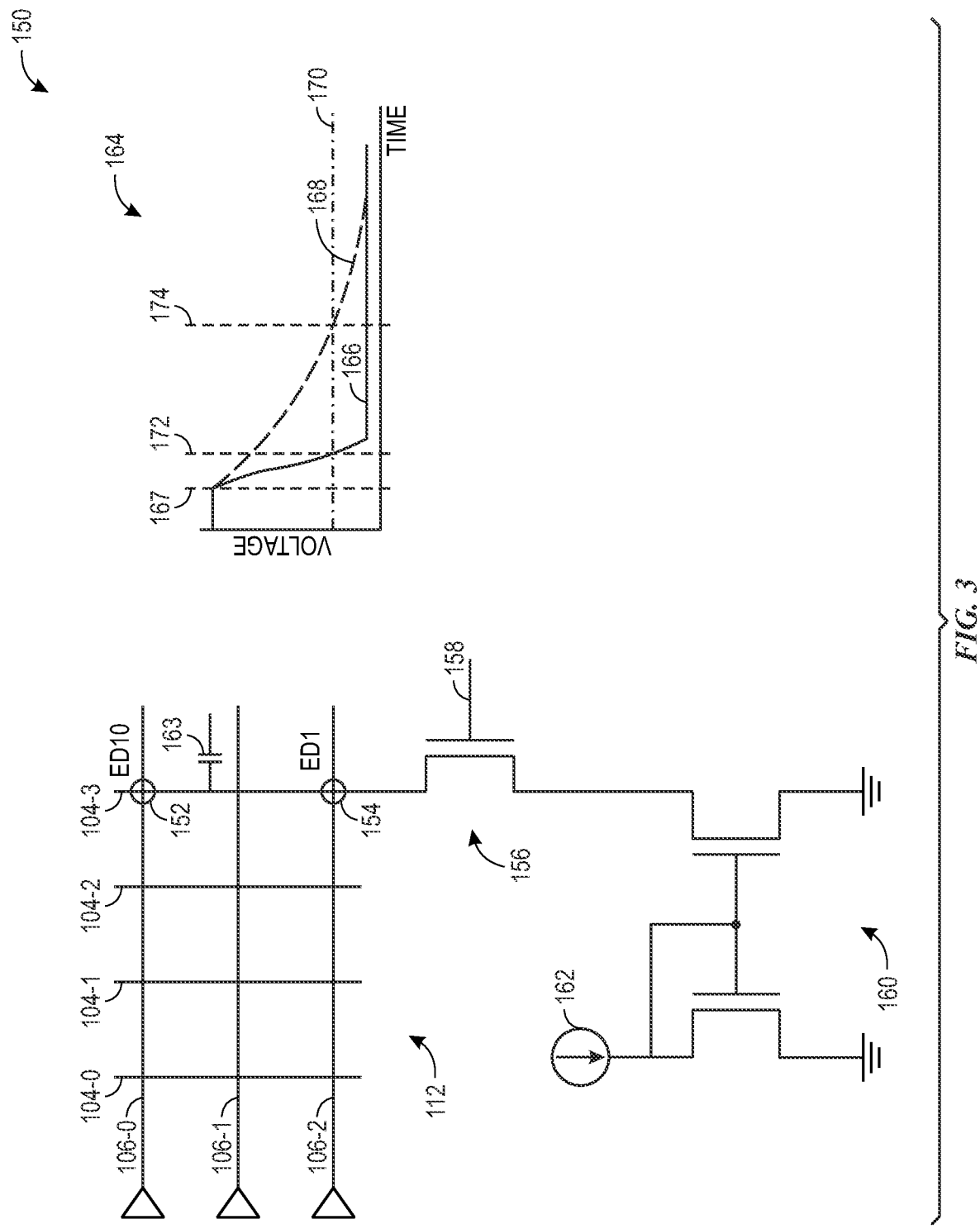
FIG. 3 is a circuit diagram of the memory device of FIG. 1, according to an embodiment of the present disclosure.

FIG. 3 is a simplified diagram of a deck of a memory device 150 that may be an embodiment of the memory device 100. As previously discussed, at the intersections of the bitlines 104 and the wordlines 106 in the memory array 112, the memory cells 102 may be used to store information. However, the memory cells 102 have been omitted from FIG. 3 for simplicity. A selected bitline 104-3 may be used to read and/or write data at intersections 152 and 154. A local driver 156 may supply a signal to the intersections 152 and 154 via the selected bitline 104-3. The local driver 156 may be used to gate a voltage to the intersections 152 and 154. The local driver 156 performs gating using a control signal 158 that is driven by the control circuit 122. The voltage provided to the intersections 152 and 154 are provided using current supplied via a current mirror 160 from a current supply 162.

As may be appreciated, the memory array 112 may include parasitic capacitance represented by a capacitor 163. Based at least in part on the parasitic capacitance and/or resistance in the memory array 112, different intersections have a different electrical distance (ED) that causes different voltages to be seen at different cells. In other words, a voltage seen at the intersection 152 may differ from a voltage seen at the intersection 154. For instance, a graph 164 plots voltage changes over time. For instance, the graph 164 shows an example of a voltage 166 that may occur at the intersection 154. As illustrated, the voltage 166 has a relatively high slope after time 167. The graph 164 also shows a voltage 168 that may occur at the intersection 152. The voltage 168 has a relatively low slope after the time 167. Thus, using a threshold 170, the intersection 154 (e.g., the corresponding memory cell 102) snaps at an earlier time 172 than the intersection 152 at a later time 174. Based on the snapping and rapid change in voltage over a short period of time, the intersection 154 may receive a higher current that, without mitigation, may cause the corresponding memory cell 102 to degrade more quickly than a memory cell at the intersection 152.

Figure 4:
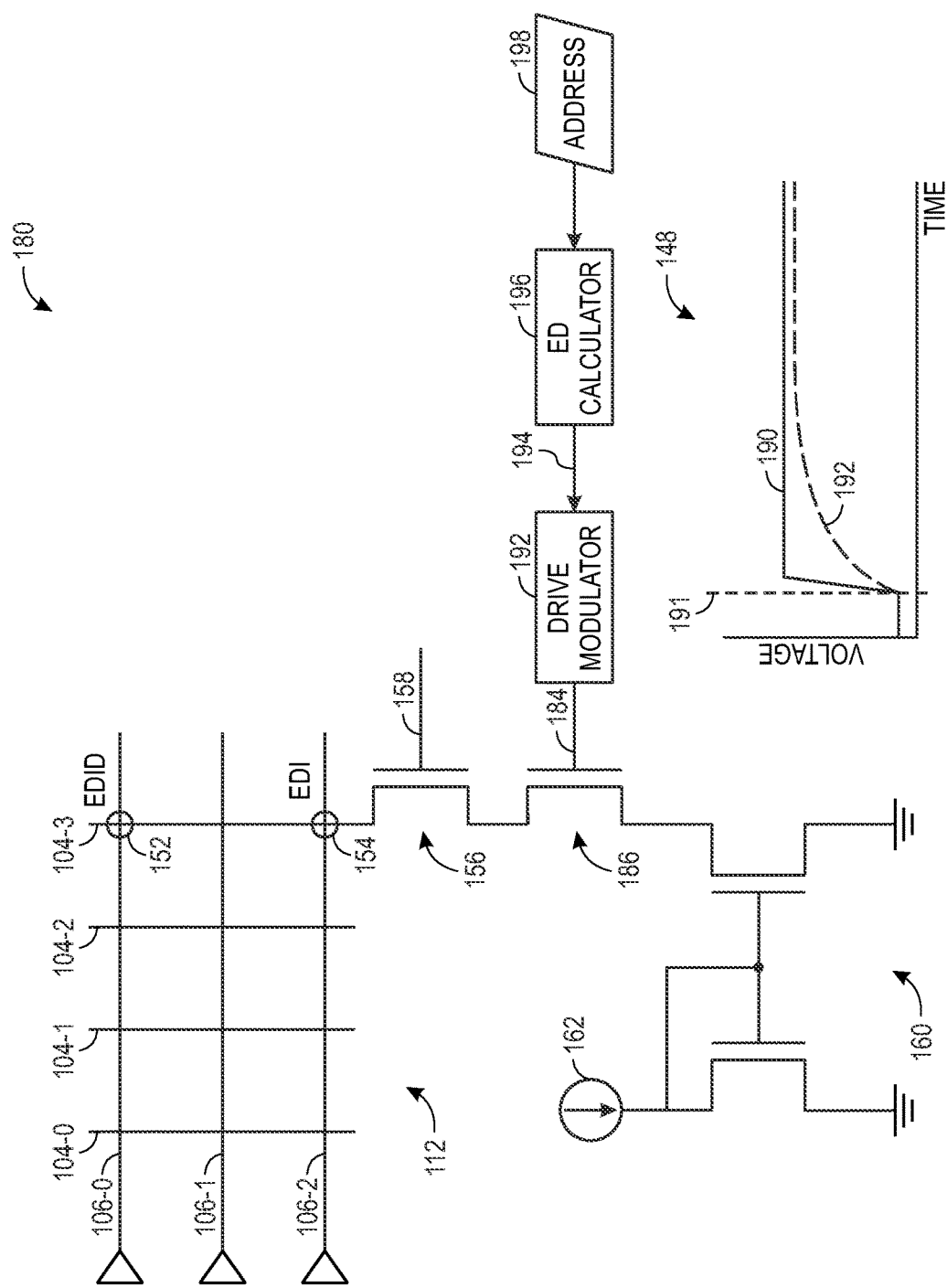
FIG. 4 is a circuit diagram of the memory device of FIG. 1 having a drive modulator, according to an embodiment of the present disclosure.

To mitigate for the quicker snapping at the intersection 154, the memory device 100 may modulate the driving of the intersections to cause the intersections 152 and 154 to be driven similarly with similar currents and/or voltages. For instance, FIG. 4 illustrates a diagram of a deck of a memory device 180 that utilizes a drive modulator 182 to modulate the voltage and/or current on the bitline 104-3. The drive modulator 182 modulates the voltage and/or current on the bitline 104-3 by modifying a control signal 184 applied to a gate of a transistor 186.

The control signal 184 causes the transistor 186 to transmit the voltage and/or current from the current mirror 160 differently to different memory cells 102 based on the ED between the memory cell 102 and the local driver 156. Graph 148 illustrates a graph of voltage over time of a signal transmitted from the transistor 186 to the memory array 112. As illustrated, a first voltage 190 that has a steep slope after time 191. The voltage 190 may be used for a memory cell 102 at the intersection 152 or any other intersections with an ED above a threshold distance. The steep slope of the voltage 190 may be used to drive the far intersections (e.g., intersection 152) due to the gradual change in the corresponding voltage 168. A different voltage or voltages may be used for closer intersections (e.g., intersection 154) to compensate for the quicker slope of the voltage 166. For example, a voltage 192 with a more gradual slope than the voltage 190 may be used to drive the intersection 154. By reducing the slope of the change of the voltage 190 in driving the closer intersections, the voltage received at the closer intersections may more closely emulate the voltage 168.

In some embodiments, more than two different voltages may be used for different intersections. For instance, each intersection may have a corresponding voltage slope. Additionally or alternatively, each ED may have a corresponding voltage slope to be used to drive corresponding intersections with the ED. In other words, the drive modulator may have two or more voltage slopes used to drive two or more intersections with corresponding memory cells to cause each of the voltages at each of the intersections to approximate the voltage 168. Thus, the different voltages may be used to compensate for differences in electrical properties from the local driver 156 to the different intersections of the memory array 112 in a bitline 104 and/or wordline 106. Therefore, using the bitline 104-3 as an example, the different transmitted voltages cause arriving voltages at the intersection 152 and 154 to both approximate the voltage 168 regardless of the parasitic capacitances and/or resistances of the bitline 104-3. The same compensation principles may be applied to any other intersection of bitlines 104 and wordlines 106 based on the electrical distance from drivers of the bitlines 104 and/or the wordlines 106.

The drive modulator 182 may modify the control signal 184 based at least in part on an electrical distance (ED) indicator 194 that is output from an ED calculator 196 that calculates an ED of a respective intersection based at least in part on an address 198 of the respective intersection. The address 198 may be provided from the control circuit 122 when a corresponding memory cell 102 is accessed. The ED calculator 196 may include a lookup table (LUT) that is used to store an ED for the different intersections. In certain embodiments, the drive modulator 182 and/or the ED calculator 196 may be included in the control circuit 122.

Figure 5:
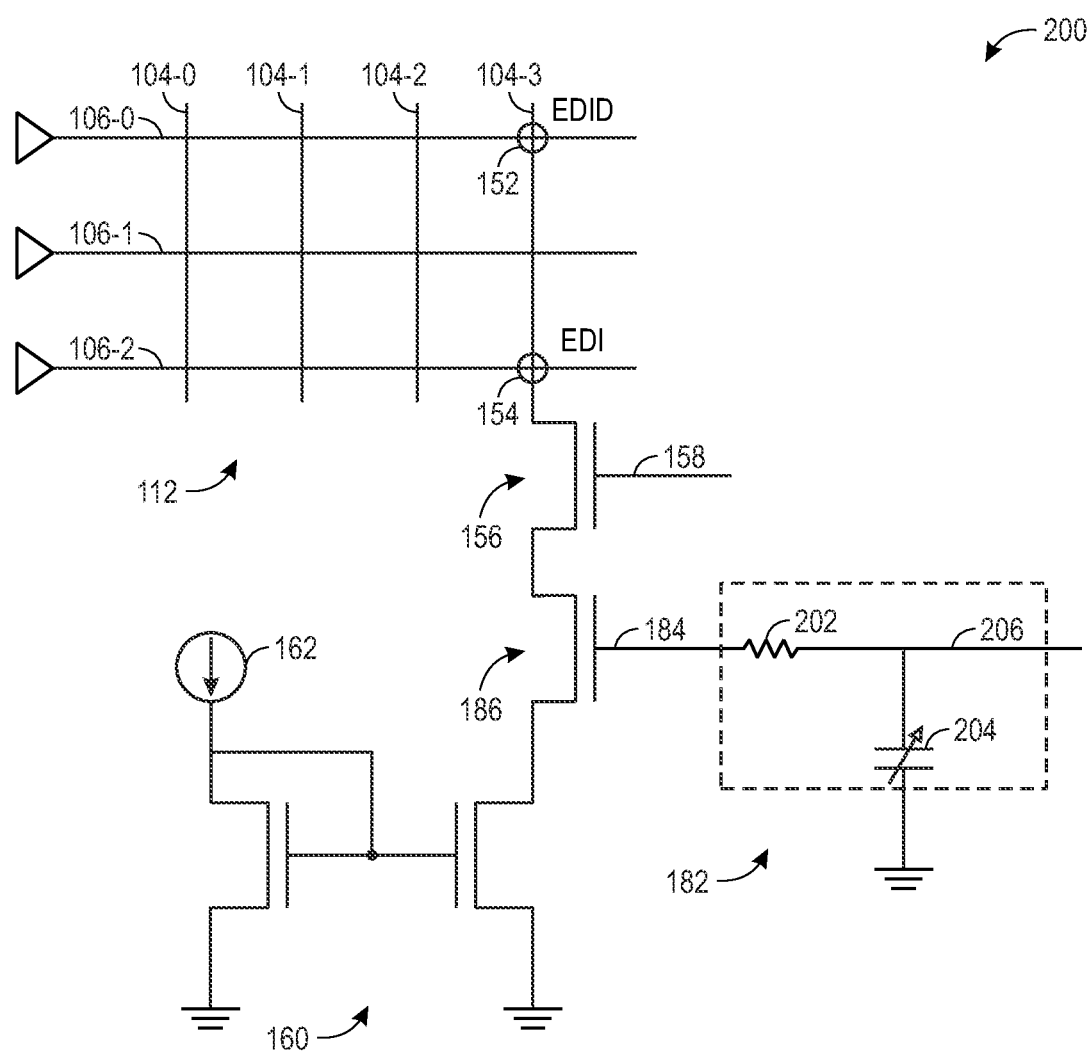
FIG. 5 is a circuit diagram of the memory device of FIG. 4 with the drive modulator implemented using a resistor-capacitor (RC) filter, according to an embodiment of the present disclosure.

FIG. 5 is a schematic diagram of a deck of a memory device 200 that may be an embodiment of the memory device 150 and/or 100. In the memory device 200, the drive modulator 182 is implemented using a resistor-capacitor (RC) filter. The RC filter includes a resistor 202 and a variable capacitor 204. The RC filter may be arranged to perform as a low pass filter (LFP). The LPF may be used to smooth a pulse from a square wave to a wave with a smaller slope. The amount of filtration applied to the control signal 158 may vary with the amount of capacitance set for the variable capacitor 204. The amount of capacitance applied to a signal 206 is varied by the ED of a respective intersection. For instance, the control circuit 122 may set the capacitance to a relatively high value for the intersection 154 to transmit the voltage 192 with a relatively low slope from the transistor 186. The control circuit 122 also may set the capacitance to a relatively low value for the intersection 152 to transmit the voltage 192 with a relatively low slope. The different transmitted voltages cause both arriving voltages at the intersection 152 and 154 to both approximate the voltage 168 regardless of the parasitic capacitances and/or resistances of the bitline 104-3. Similar techniques may be applied to any other intersection of bitlines 104 and wordlines 106 based on an electrical distance between the respective intersection and respective drivers of the bitlines 104 and/or the wordlines 106.

Figure 6:
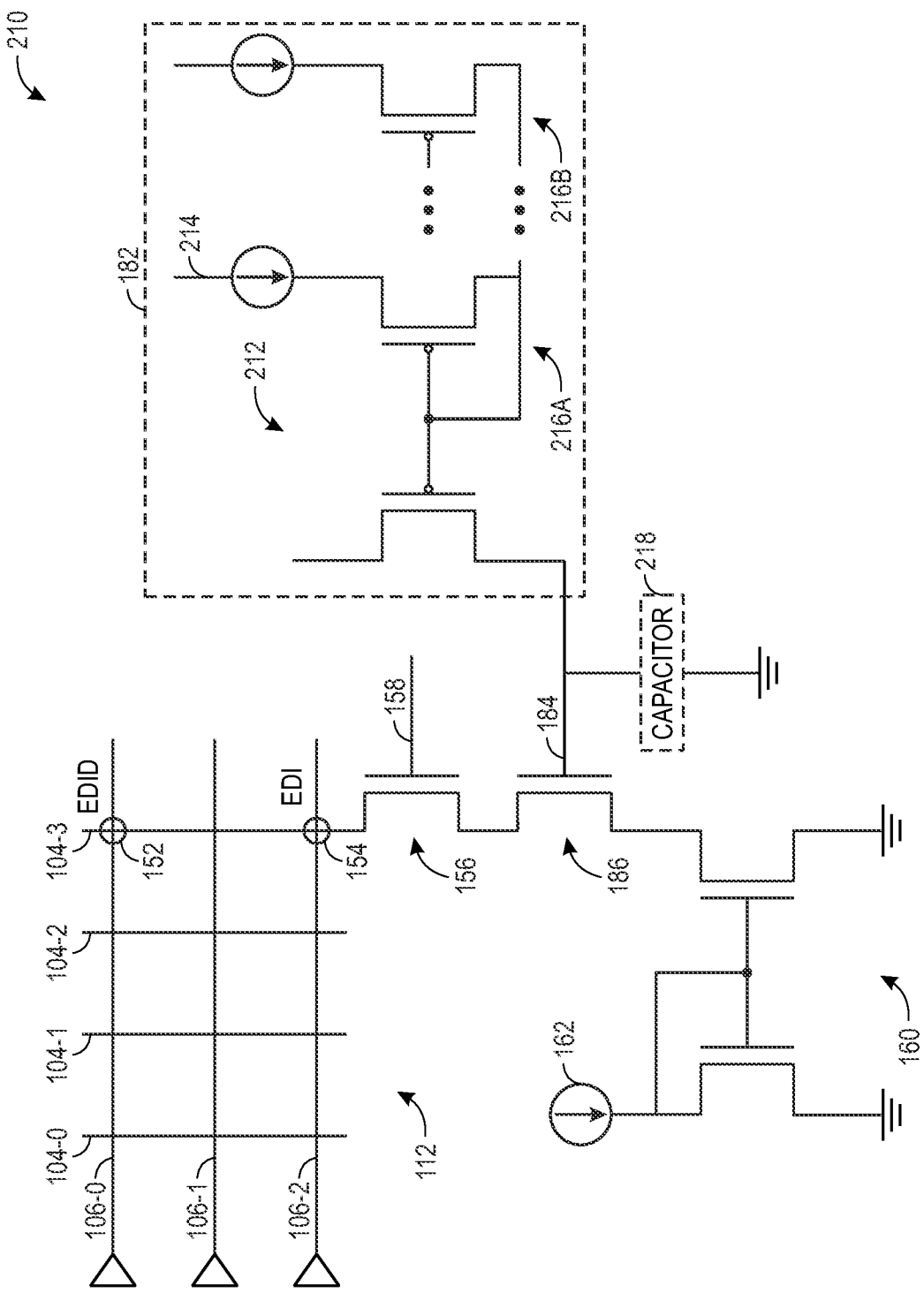
FIG. 6 is a circuit diagram of the memory device of FIG. 4 with the drive modulator implemented using a current mirror, according to an embodiment of the present disclosure.

FIG. 6 is a schematic diagram of a memory device 210 that may be an embodiment of the memory device 150 and/or 100. In the memory device 210, the drive modulator 182 is implemented using a current mirror 212. As illustrated, the current mirror 212 receives a signal 214 that is passed as the control signal 184. The control signal 184 is formed by the current mirror 212 based on the ED of the respective intersection to be accessed. Specifically, a number of legs 216 (e.g., legs 216A and 216B) may be used according to the ED of the intersection to be accessed. For instance, the leg 216A may be used when the intersection 154 is to be accessed. The leg 216B may be used when the intersection 152 is to be accessed. In some embodiments, each leg 216 may be used individually. Additionally or alternatively, some legs 216 may be used together to drive at least some of the intersections. For example, the legs 216A and 216B may be used together to drive the intersection 152. In some embodiments, the current mirror 212 may be supplemented using an optional capacitor 218 to refine the shape of the control signal 184 to be applied to the transistor 186. As previously noted, the control signal 184 causes the transistor 186 to transmit different voltages. The different transmitted voltages cause arriving voltages at different intersections (e.g., the intersections 152 and 154) to each approximate the voltage 168 regardless of the parasitic capacitances and/or resistances of the bitline 104-3. Similar techniques may be applied to any other intersection of bitlines 104 and wordlines 106 based on an electrical distance between the respective intersection and respective drivers of the bitlines 104 and/or the wordlines 106.

Technical effects of the present disclosure include systems and methods that enable memory cells located at near and far intersections may be driven similarly using waveshaping to compensate for the differences in transmissions lines resistance and/or capacitance. By driving the memory cells located at the near and far intersections, the memory device may perform more consistently and may reduce wear for the memory cells located at the near intersections. For instance, the waveforms of the signals transmitted to the near intersections may emulate the signals received at the far intersections.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   a plurality of access lines arranged in a grid;
   a plurality of memory cells located at intersections of the access lines in the grid;
   a plurality of drivers, each configured to transmit a corresponding signal to respective memory cells of the plurality of memory cells; and
   a driver modulator configured to modulate the corresponding signal based at least in part on a distance of a respective intersection from its respective drivers of the plurality of drivers.

2. The device of claim 1, wherein the access lines comprise bitlines and wordlines, wherein modulating the corresponding signal may comprise modulating driving of a respective bitline, a respective wordline, or both.

3. The device of claim 1, wherein the grid comprises the plurality of memory cells disposed in a same plane with additional memory cells in one or more other parallel planes.

4. The device of claim 1, comprising a transistor configured to receive a control signal from the drive modulator and to modulate the corresponding signal based at least in part on the control signal.

5. The device of claim 4, wherein modulating the corresponding signal based at least in part on the control signal comprises applying the control signal at a gate of the transistor.

6. The device of claim 4, wherein the drive modulator comprises a resistor-capacitor filter comprising a resistor and a capacitor configured to perform low-pass filtration to generate the control signal.

7. The device of claim 6, wherein the capacitor comprises a variable capacitor, wherein the driver modulator is configured to adjust the capacitance of the variable capacitor based at least in part on the distance to cause more gradual slope changes in the control signal for intersections with smaller distances from respective drivers.

8. The device of claim 4, wherein the drive modulator comprises a current mirror configured to generate the control signal based at least in part on the distance.

9. The device of claim 8, wherein a number of legs used by the current mirror to generate the control signal is based at least in part on the distance.

10. The device of claim 1, comprising a lookup table that stores modulation levels based on respective distances of intersections from respective drivers.

11. A method, comprising:
    receiving an indication of a memory cell of a plurality of memory cells of a memory device, wherein the plurality of memory cells is distributed in a memory array at a plurality of intersections of wordlines and bitlines of the memory device, wherein the memory cell is indicated as to-be-accessed and is located at a particular intersection of the wordlines and the bitlines; and
    modulating, using a drive modulator, a waveshape transmitted to the memory cell based at least in part on a distance of the memory cell from respective drivers.

12. The method of claim 11, comprising determining the distance by looking up the distance in a lookup table.

13. The method of claim 12, wherein the indication comprises an address of the memory cell, wherein looking up the distance in the lookup table comprises using the address to lookup the distance.

14. The method of claim 11, wherein modulating the waveshape comprises generating a control signal, and wherein modulating the waveshape comprises applying the control signal to a gate of a transistor to modulate the waveshape.

15. The method of claim 14, wherein the drive modulator comprises a low pass filter comprising a variable capacitor, wherein modulating the waveshape comprises generating the control signal using a capacitance for the variable capacitor that is based at least in part on the distance of the memory cell.

16. The method of claim 15, wherein modulating the waveshape comprises smoothing the waveshape to have a more gradual slope for shorter distances.

17. The method of claim 14, wherein the drive modulator comprises a current mirror, wherein a number of legs used in the current mirror for the memory cell is based at least in part on the distance.

18. The method of claim 12, wherein modulating the waveshape comprises modulating signals on a wordline, a bitline, or both.

19. A memory device, comprising:
    a plurality of bitlines arranged in parallel to each other;
    a plurality of wordlines arranged parallel to each other and perpendicular to the plurality of bitlines;
    a plurality of memory cells located at intersections of the plurality of bitlines and the plurality of wordlines;
    a plurality of drivers, each configured to transmit a corresponding signal to respective memory cells of the plurality of memory cells; and a driver modulator configured to generate a control signal configured to modulate the corresponding signal based at least in part on a distance from a memory cell of the plurality of memory cells to respective drivers of the plurality of drivers.

20. The memory device of claim 19, wherein the driver modulator comprises a low pass filter that is configured to:
modulate the control signal for close memory cells to a more gradual slope when the distance is less than a threshold distance from the respective drivers; and
modulate the control signal for far memory cells to a less gradual slope when the distance is greater than or equal to the threshold distance from the respective drivers.

* * * * *